(12) United States Patent
Williams et al.

(10) Patent No.: US 8,089,384 B1
(45) Date of Patent: *Jan. 3, 2012

(54) PROGRAMMABLE DIGITAL-TO-ANALOG CONVERTER

(75) Inventors: Timothy J. Williams, Bellevue, WA (US); James H. Shutt, Seattle, WA (US); Warren Snyder, Snohomish, WA (US); Dennis Seguine, Monroe, WA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/754,431

(22) Filed: Apr. 5, 2010

Related U.S. Application Data

(63) Continuation of application No. 12/748,085, filed on Mar. 26, 2010.

(60) Provisional application No. 61/176,907, filed on May 10, 2009.

(51) Int. Cl.
*H03M 1/66* (2006.01)
(52) U.S. Cl. ........................ 341/144; 341/136
(58) Field of Classification Search .................. 341/133, 341/135, 136, 144
See application file for complete search history.

(56) References Cited

U.S. PATENT DOCUMENTS

| | | | | |
|---|---|---|---|---|
| 5,696,988 | A * | 12/1997 | Dale et al. ..................... | 341/144 |
| 6,741,195 | B1 * | 5/2004 | Cho .............................. | 341/136 |
| 7,728,749 | B2 * | 6/2010 | Sahu ............................. | 341/144 |
| 2002/0063644 | A1 * | 5/2002 | Clara et al. .................... | 341/136 |
| 2002/0109618 | A1 * | 8/2002 | Clara et al. .................... | 341/136 |
| 2004/0233087 | A1 * | 11/2004 | Blackburn .................... | 341/144 |
| 2009/0167579 | A1 * | 7/2009 | Kawano ........................ | 341/135 |

OTHER PUBLICATIONS

Analog Devices Inc. Data Sheet AD5412/5422, Rev. C Mar. 2010, Rev. 0 May 2009.*

* cited by examiner

*Primary Examiner* — Howard Williams

(57) ABSTRACT

A multi-mode digital-to-analog converter (DAC) configured to operate in a plurality of modes.

22 Claims, 5 Drawing Sheets

PROGRAMMABLE DIGITAL-TO-ANALOG CONVERTER

RELATED APPLICATIONS

This application is a continuation U.S. patent application Ser. No. 12/748,085, filed Mar. 26, 2010, which claims the benefit of U.S. Provisional Application No. 61/176,907, filed May 10, 2009, which are incorporated herein by reference.

TECHNICAL FIELD

The present invention relates generally to digital-to-analog converters (DACs) and, more particularly, to programmable DACs.

BACKGROUND

In electronics, a digital-to-analog converter, commonly referred to as a DAC or D-to-A), is a device for converting digital code to an analog signals (current or voltage). DACs can be configured using various types of configurations, such a pulse-width modulator DAC, a delta-sigma DAC, which use a pulse density conversion technique, a binary-weighted DAC, etc. Conventionally, a DAC receives a digital code input and provides either a voltage output or a current output; thus, limiting the DAC to be either a voltage-only DAC or a current-only DAC. When a system needs both types of DACs, the system requires two independent circuits, one circuit to implement a voltage-only DAC 110 and another circuit to implement a current-only DAC 120, such as illustrated in FIG. 1. Also, these two independent circuits need to each receive a digital code input, and, typically have fixed resolutions, such as, for example, 8 bits or 6 bits only, and fixed data rates. The current-only DAC 120 may be either a current source or a current sink. Thus, a system that needs a voltage-only DAC 110 and both a current source DAC and a current sink DAC requires three independent circuits, each of which receive a digital code input to provide the respective output. By adding independent circuits to achieve the alternate functionalities, the number of components required for the system increases, as well as the space used to implement these components.

BRIEF DESCRIPTION OF THE DRAWINGS

The present disclosure is illustrated by way of example, and not by way of limitation, in the figures of the accompanying drawings.

DETAILED DESCRIPTION

Figure 1:
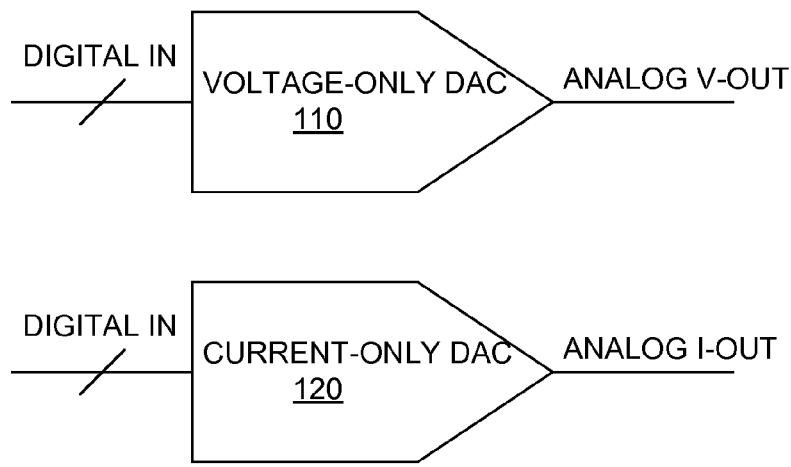
FIG. 1 illustrates a system including a voltage-only DAC and a current-only DAC, each of which receive a digital input and provide a voltage output and a current output, respectively.

A multi-mode DAC configured to operate in multiple modes, including, for example, a voltage mode, a current mode, or a voltage-current mode, is described. In one embodiment, the multi-mode DAC is configured to receive a digital code input, provide an analog current output, corresponding to the digital code input, on a first output terminal of the multi-mode DAC when in the current mode, and provide a voltage output, corresponding to the digital code input, on a second output terminal of the multi-mode DAC when in the voltage mode. In another embodiment, the multi-mode DAC has a programmable output range for each of the multiple modes, including a multi-range current output when in the current mode and a multi-range voltage output when in the voltage mode. In another embodiment, the multi-mode DAC has a programmable trimming circuit configured to individually adjust the output range for each of the multiple modes. In another embodiment, the multi-mode DAC has a programmable current output circuit configured to select a current sink or a current source for the current output.

The embodiments described herein provide a highly flexible DAC that has multiple modes. These embodiments provide voltage or current output from the same circuitry block, instead of using independent circuits as done conventionally. These embodiments allow efficient implementation of many DAC functions, allowing the resolution, data rate, output ranges, output analog signal format, and trimming capability of the multi-mode DAC to be programmed. In particular, the embodiments described herein may provide the following capabilities, which are described herein: 1) ability to support a variety of analog signal formats, like voltage, current, and charge; 2) ability to support varying data rate and resolution requirements; 3) ability to combine multiple on-chip DACs to create additional functionality; 4) ability to independently trim each mode, regardless of whether the mode is a current mode, a voltage mode, or a voltage-current mode; 5) ability to sink or source current dynamically at the time of operation; 6) ability to combine the voltage and/or current outputs with other circuits, such as voltage or trans-impedance amplifiers, filters, or the like.

The following description sets forth numerous specific details such as examples of specific systems, components, methods, and so forth, in order to provide a good understanding of several embodiments of the present invention. It will be apparent to one skilled in the art, however, that at least some embodiments of the present invention may be practiced without these specific details. In other instances, well-known components or methods are not described in detail or are presented in a simple block diagram format in order to avoid unnecessarily obscuring the present invention. Thus, the specific details set forth are merely exemplary. Particular implementations may vary from these exemplary details and still be contemplated to be within the spirit and scope of the present invention.

References in the description to "one embodiment" or "an embodiment" means that a particular feature, structure, or characteristic described in connection with the embodiment is included in at least one embodiment of the invention. The appearances of the phrase "in one embodiment" in various places in the specification do not necessarily all refer to the same embodiment.

Figure 2:
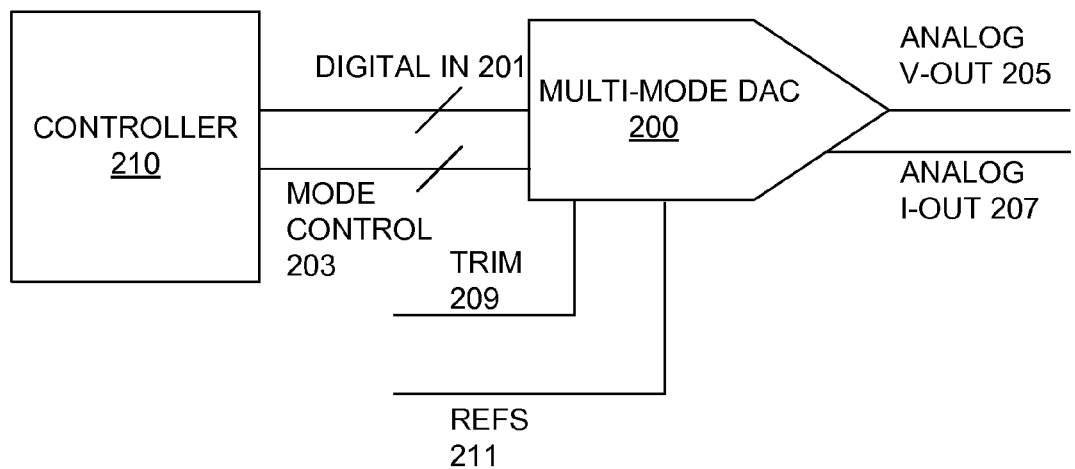
FIG. 2 illustrates one embodiment of a multi-mode DAC configured to operate in multiple modes.

FIG. 2 illustrates one embodiment of a multi-mode DAC 200 configured to operate in multiple modes. The multi-mode DAC 200 receives a digital code input 201, and one or more mode-control signals 203. In another embodiment, the multi-mode DAC 200 also receives a trimming input 209 and one or more references 211, such as one or more voltage and current references. The digital code input 201 and mode-control signals 203 and 209 may be received on one or more bus lines that are coupled between the multi-mode DAC 200 and a controller 210. Using the mode-control signals 203, the controller 210 can program the multi-mode DAC 200 to operate in one of the multiple modes, such as a current mode, a voltage mode, a voltage-current mode, a current sink mode, a current source mode, as well as other modes as would be appreciated by one of ordinary skill in the art having the benefit of this disclosure. The multi-mode DAC 200 may also have a programmable output range for each of the modes, including, for example, a multi-range current output and a multi-range voltage output. Using the mode-control signals 203, the controller 210 may program the multi-mode DAC 200 to provide the voltage output 205 and/or the current output 207 in the programmed output range.

In another embodiment, each of these output ranges may be trimmed using the trimming input 209. In one embodiment, the controller 210 provides the trimming input 209 to the multi-mode DAC 200. In other embodiments, the multi-mode DAC 200 receives the trimming input 209 from other sources as would be appreciated by one of ordinary skill in the art having the benefit of this disclosure.

In one embodiment, the controller 210 uses a state machine to provide the appropriate mode-control signals 203 to the multi-mode DAC 200. Alternatively, the controller 210 may provide the mode-control signals 203 in other manners as would be appreciated by one of ordinary skill in the art having the benefit of this disclosure, such as the controller 210 executing a program that allows a user to program the multiple modes of the multi-mode DAC 200. The controller 210 can use hardware, firmware, software, or any combination thereof to program the multi-mode DAC 200 to operate in the multiple modes as described herein. In one embodiment, the controller 210 is a processing element of a programmable system, such as the Programmable System on a Chip (PSOC®), developed by Cypress Semiconductor, of San Jose, Calif. Alternatively, the controller 210 may be a microcontroller, a microprocessor, a processor, a direct memory access (DMA) controller, programmable logic, or other type of processing element that can provide the digital code input 201 and one or more mode-control signals 203 and/or 209. The controller 210 may also supply the one or more references 211.

Based on the digital code input 201, as well as the other inputs, the multi-mode DAC 200 is configured to provide a current output 207 on a first output terminal or a voltage output 205 on a second output terminal. In another embodiment, the multi-mode DAC 200 is configured to provide both the current output 207 and the voltage output 205 simultaneously, or at least concurrently. In another embodiment, the multi-mode DAC 200 is configured to provide the current output 207 or the voltage output 205 on a single output terminal. For example, the voltage output 205 and the current output 207 may be coupled to a multiplexer (such as illustrated at the output of the multi-mode DAC 200 in FIG. 6) that is controlled by the controller 210, such as using one of the mode control signals 203, to select the voltage output 205 or the current output 207 based on the mode. In one embodiment, the multi-mode DAC 200 is configured to operate in multiple modes, including, for example, a current mode, a voltage mode, and a voltage-current mode. For example, in one embodiment, the multi-mode DAC 200 has a mode-select terminal that receives a mode-select signal as one of the mode-control signals 203, and based on the mode selected, the multi-mode DAC 200 provides the corresponding output. For example, when a current mode is selected, the multi-mode DAC 200 provides the current output 207, and when a voltage mode is selected, the multi-mode DAC 200 provides the voltage output 205.

In other embodiments, the multi-mode DAC 200 may be programmed in more than these two modes. For example, in one embodiment, the multi-mode DAC 200 receives mode-select signals 203 to select one of a voltage mode, a current mode, or a voltage-current mode. In the voltage-current mode, the multi-mode DAC 200 provides both the current output 207 and the voltage output 205 concurrently or simultaneously based on the same digital input value. In another embodiment, the mode-control signals 203 can program the multi-mode DAC 200 to provide a current sink on the current output 207 or a current source on the current output 207. In another embodiment, the mode-control signals 203 can be used to program the output range of the voltage output 205 and the current output 207 in each of the modes. For example, the multi-mode DAC 200 may receive a scaling value as part of the one or more mode-control signals 203, and the multi-mode DAC 200 may scale the current output 207 and/or voltage output 205 according to the received scaling value.

Figure 3:
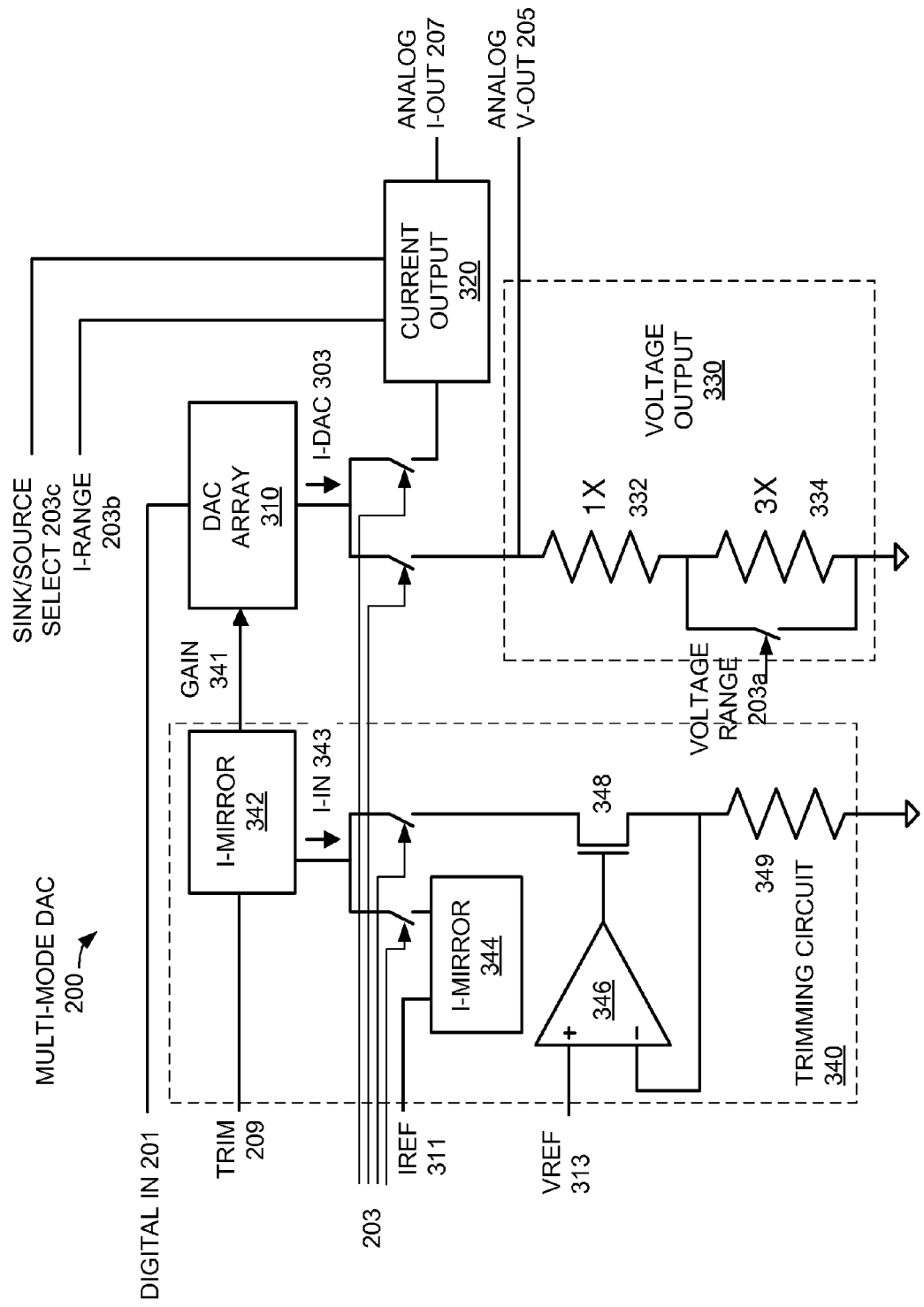
FIG. 3 illustrates one embodiment of the multi-mode DAC of FIG. 2, including a DAC array, a current output circuit, and a voltage output circuit.

FIG. 3 illustrates one embodiment of the multi-mode DAC of FIG. 2, including a DAC array 310, a current output circuit 320, and a voltage output circuit 330. The DAC array 310 is configured to receive the digital input code and provide an analog current output 303 (labeled as I-DAC current 303). In one embodiment, the multi-mode DAC 200 provides the I-DAC current 303 as the analog current output 207. In another embodiment, the multi-mode DAC 200 uses a current output circuit 320, which receives the I-DAC current 303 from the DAC array 310 and provides the current output 207 on the first output terminal. The current output circuit 320 may receive one or more mode-control signals 203, such as a selection input 203$c$ (labeled as sink/source select 203$c$) and/or a current range input 203$b$. The selection input 203$c$ configures the current output circuit 320 to operate as either a current sink or a current source, and the current range input 203$b$ selects the gain of the current output circuit 320 to scale the current output 207 accordingly. One embodiment of the current output circuit 320 is described and illustrated with respect to FIG. 4.

The depicted multi-mode DAC 200 also includes the voltage output circuit 330, which receives the I-DAC current 303 from the DAC array 310 and provides the voltage output 205 on the second output terminal. The voltage output circuit 330 is configured to convert the I-DAC current 303 of the DAC array 310 into the voltage output 205. In one embodiment, the voltage output circuit 205 receives one or more mode-control signals 203, such as the voltage range input 203$a$. In one embodiment, the voltage output circuit 330 includes a selectable resistance to scale the voltage output according to the voltage range input 203$a$. In the depicted embodiment, the voltage output circuit 330 includes a first resistor 332 (1×), which when selected converts the I-DAC current 303 into the voltage output 205 scales the voltage conversion by one. The voltage range input 203$a$ may be used to switch in a second resistor 334 (3×), which when switched into series with the first resistor scales the voltage conversion by four. Alternatively, the voltage output circuit 330 may include other valued resistors and may include more resistors that can be switched in and out in series, or in parallel, to scale the voltage to the appropriate voltage output range. Similarly, the voltage output circuit 330 may use other types of voltage conversion circuits to convert the I-DAC current 303 to the voltage output 205 as would be appreciated by one of ordinary skill in the art having the benefit of this disclosure.

In the depicted embodiment, the multi-mode DAC 200 receives various mode-control signals 203 that switch in and out the current output circuit 320 and voltage output circuit 330 according to the selected mode. For example, in one embodiment, when the current output circuit 320 is switched on, the voltage output circuit 330 is switched off, and vice versa. In another embodiment, the current output circuit 320 and the voltage output circuit 330 are switched on at the same time, providing both the current output 207 and the voltage output 205.

In the depicted embodiment, the multi-mode DAC 200 also includes a programmable trimming circuit 340, including a first current mirror 342, a second current minor 344, an operational amplifier 346, a transistor 348, and a resistor 349. The programmable trimming circuit 340 provides independent trim capability for any mode. In response to the trimming signal 209, the trimming circuit 340 provides a corresponding gain 341 to the DAC array 310 to adjust the I-DAC current 303. The trimming circuit 340 is configured to individually adjust the current output 207 and the voltage output 205 within the respective mode. For example, the trimming circuit 340 can trim the current output 207 and the voltage output 205 within the respective output ranges. Using the programmable output range for each of the modes and the programmable trimming circuit 340, the multi-mode DAC 200 can efficiently implement various DAC functions.

Figure 6:
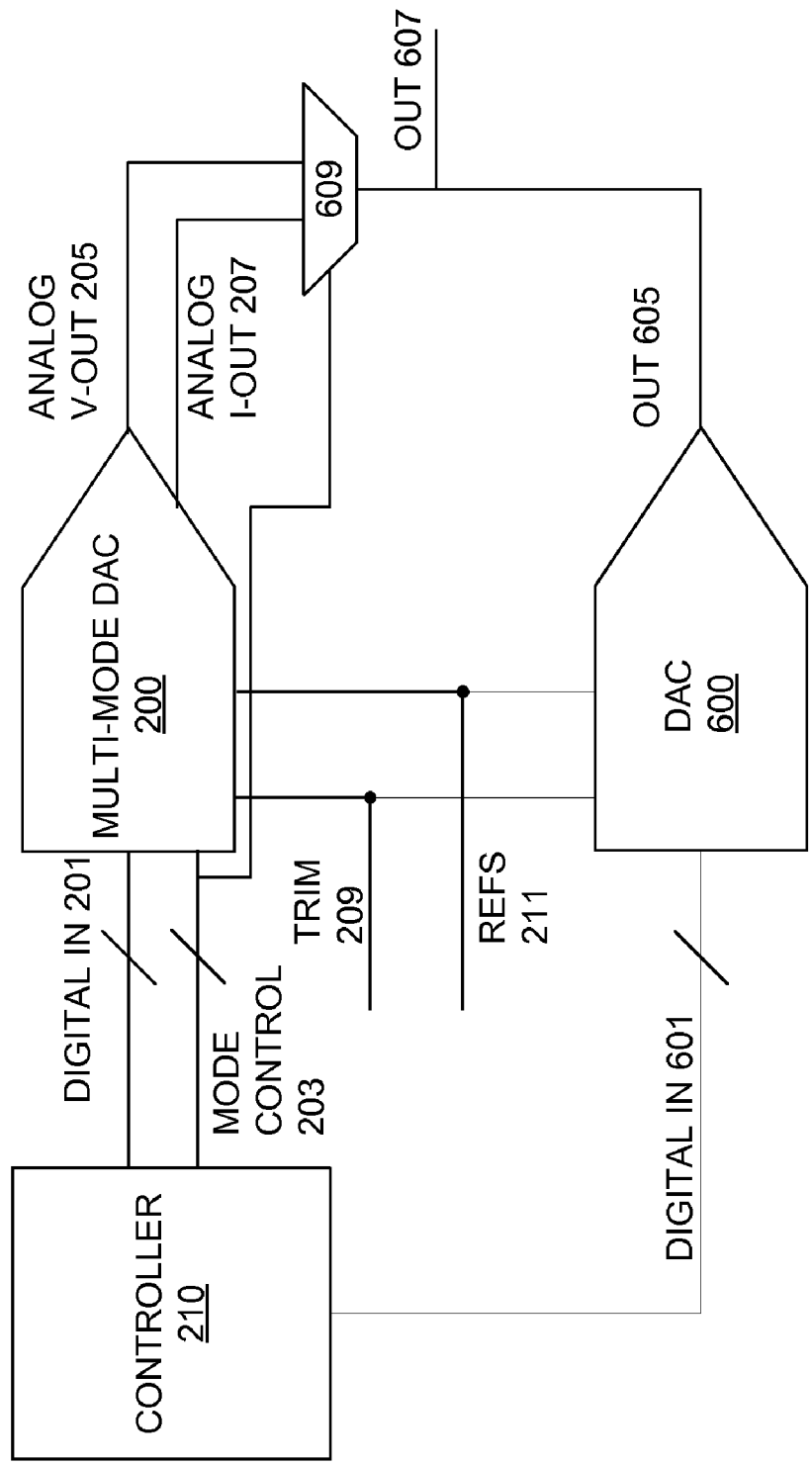
FIG. 6 illustrates one embodiment of a multi-mode DAC of FIG. 2 whose output is coupled to an output of a DAC.

The multi-mode DAC 200 may also be combined with other multi-mode DACs to offer additional capability. FIG. 6 illustrates one embodiment of the multi-mode DAC 200 of FIG. 2 whose output is coupled to an output of a DAC 600. In one embodiment, the DAC 600 is a non-multi-mode DAC that receives a digital input code 601 and provides a current or voltage output 605 corresponding to the digital input code 601. The DAC 600 may receive the same references 211 as the multi-mode DAC 200 as depicted in FIG. 6; alternatively, different references may be used for the DAC 600. In another embodiment, the DAC 600 is a second multi-mode DAC that receives the digital input code 601 and may also receive one or more mode-control signals and/or trim signals from the controller 210, like the mode-control signals 203 and trim signals 209 described above with respect to FIG. 2. In the embodiment where the DAC 600 is a second multi-mode DAC, the second multi-mode DAC may provide both the current output and the voltage output on separate outputs. Also, like described above with respect to FIG. 2, the current and voltage outputs of the second multi-mode DAC 600 may be multiplexed to provide the output 605. The output 605 is combined with the output of the multi-mode DAC 200.

In one embodiment, the current output 207 from the multi-mode DAC 200 is coupled to a voltage output 605 of the DAC 600, which may be a second multi-mode DAC, to allow for finer resolution in the voltage output 607 or provide extended range of output voltages. In another embodiment, the current output from the multi-mode DAC 200 is coupled to a current output 605 of the DAC 600, which may be a second multi-mode DAC, to allow for finer resolution in the combined current output 607, or in extended range in the combined current output. Alternatively, voltage outputs 205 and 605 may be combined to provide a combined output 607. In the depicted embodiment, a multiplexer 609 is coupled to receive the voltage output 205 and the current output 207. The selected current or voltage can be added with the output 605 of the DAC 600 to provide the combined output 607. The multiplexer 609 may be controlled by the controller 210, such as using one of the mode control signals 203, to select the voltage output 205 or the current output 207 based on the mode. Alternatively, other configurations may be used to combine the functionality of the multi-mode DAC 200 with the functionality of the DAC 600, as well as other circuitry to further enhance the capabilities of the circuit.

In the depicted embodiment, the trimming circuit 340 receives one or more mode-control signals 203 to switch between a current reference 311 and a voltage reference 313 in setting an input current 343, which is used by the current mirror 342 to provide the gain 341 to the DAC array 310. When selected, the current minor 344 uses the current reference 311 to set the input current 343. When selected, the operational amplifier 346, transistor 348, and resistor 349 uses the voltage reference 313 to set the input current 343. In some embodiments, the multi-mode DAC 200 may receive only one or the other of the references 311 and 313, in which case, the trimming circuit 340 is programmed to use the current mirror 344 or the operational amplifier 346, transistor 348, and resistor 349 to set the input current 343. In other embodiments, the trimming circuit 340 may use other types of circuits as would be appreciated by one of ordinary skill in the art having the benefit of this disclosure to set the appropriate gain 341 for the DAC array 310 to trim the current output 207 and/or the voltage output 205.

Figure 4:
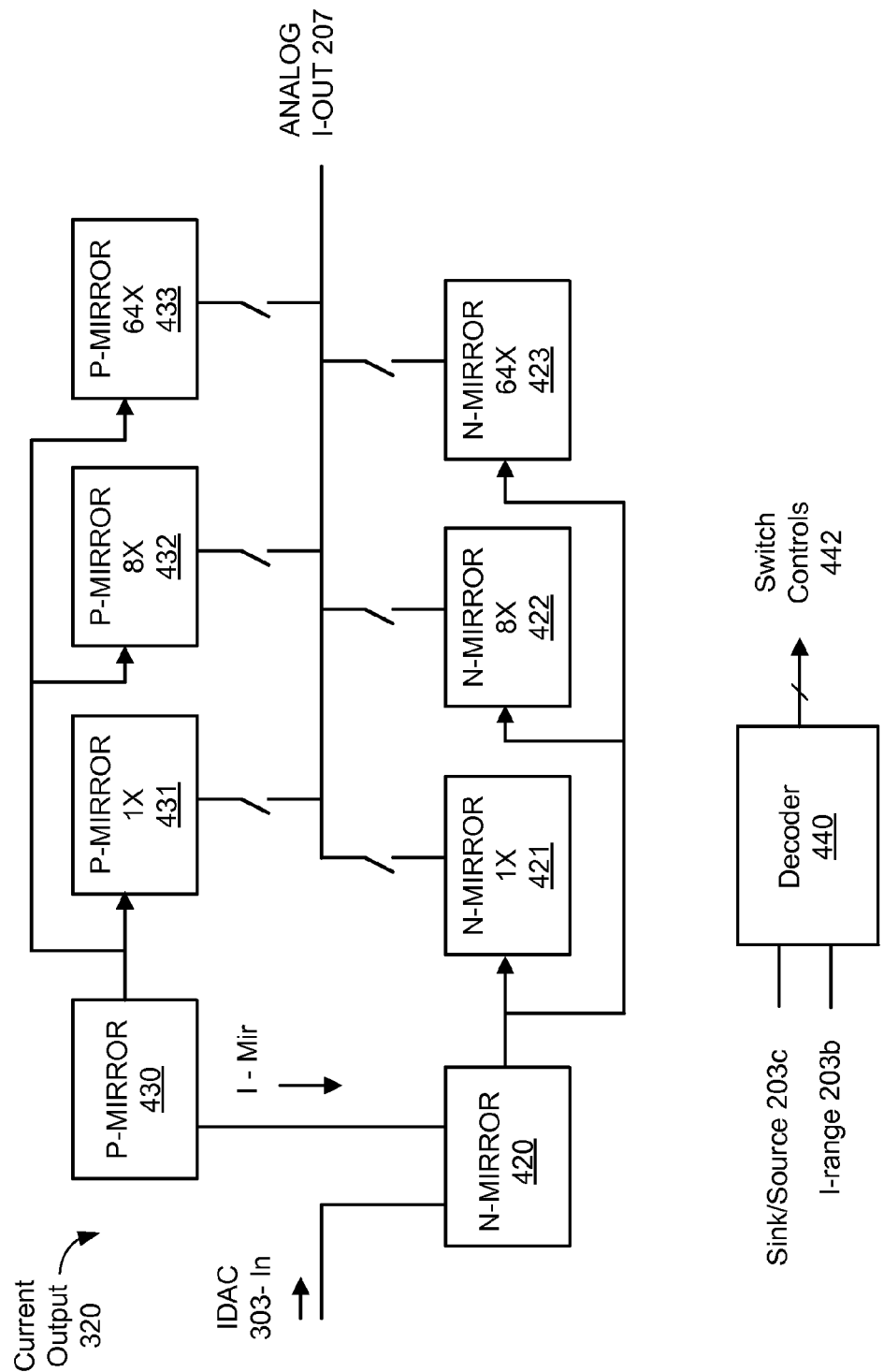
FIG. 4 illustrates one embodiment of the current output circuit of the multi-mode DAC of FIG. 3.

FIG. 4 illustrates one embodiment of the current output circuit 320 of the multi-mode DAC 200 of FIG. 3. The current output circuit 320 includes an N-type current mirror 420 (N-mirror) and a P-type current mirror 430, and a decoder 440.

The decoder 440 receives the selection input 203c (labeled as sink/source select 203c) to select whether the current output circuit 320 provides the analog current output 207 as a current sink or a current source. The decoder 440 also receives the current range input 203b to select the gain of the current output circuit 320, scaling the current output 207 accordingly. The decoder 440 provides the switch controls 442, which are used to control selection switches that select the appropriate N-type scaling current minors or P-type scaling current minors to provide the analog current output 207 as a current sink or a current source, and to scale the analog current output 207 accordingly.

The n-mirror 420 receives the I-DAC current 303 from the DAC array 310 and provides an output reference to multiple N-type scaling current mirrors, including the N-mirror 1× 421, N-mirror 8× 422, and the N-mirror 64× 423. For example, in one embodiment, the output reference is a gate-voltage connected to the N-type scaling current mirrors, which are used to produce the scaled output currents. The multiple N-type scaling current minors are configured to receive the output reference from the N-mirror 420 and to produce a scaled current output of the I-DAC current 303 according to a corresponding scaling value of the respective N-type scaling current mirror. Each of the outputs of the N-type scaling current minors is coupled to a switch controlled by one of the switch controls 442 provided by the decoder 440. Using the switch controls 442, the N-type scaling current mirrors 1×, 8×, and 64× can be individually selected to operate as a current sink for the analog current output 207.

The P-mirror 430 is coupled to the n-mirror 420 and provides an output reference to multiple P-type scaling current mirrors, including P-mirror 1× 431, P-mirror 8× 432, and P-mirror 64× 433. Like the output reference of the N-mirror 420, the output reference of the P-mirror 430 may be the gate-voltage connected to the P-type scaling current mirrors, which are used to produce the scaled output currents. The multiple P-type scaling current minors are configured to receive the output reference from the P-mirror 430 and to produce a scaled current output of the I-DAC current 303 according to a corresponding scaling value of the respective P-type scaling current mirror. Each of the outputs of the P-type scaling current minors is coupled to a switch controlled by one of the switch controls 442 provided by the decoder 440. The P-type scaling current minors 1×, 8×, and 64× can be individually selected to operate as a current source for the analog current output 207. Although these three N-type and three P-type scaling current minors have been illustrated and described with respect to FIG. 4, in other embodiments, other values may be used to achieve the desired scaled value for the current sink or current source for the analog current output 207. In other embodiments, more than one of the P-type scaling current minors or more than one of the N-type scaling current mirrors may be selected to change the scaling value of the analog current output 207 as would be appreciated by one of ordinary skill in the art having the benefit of this disclosure. It should also be noted that different scaling values can be used for the P-type scaling current mirrors than the scaling values used for the N-type scaling current minors.

It should be noted that the current output circuit 320 of FIG. 4 is one embodiment of the current output circuit 320 of FIG. 3, and in other embodiments, the current output circuit 320 can be implemented using other techniques as would be appreciated by one of ordinary skill in the art having the benefit of this disclosure.

Figure 5:
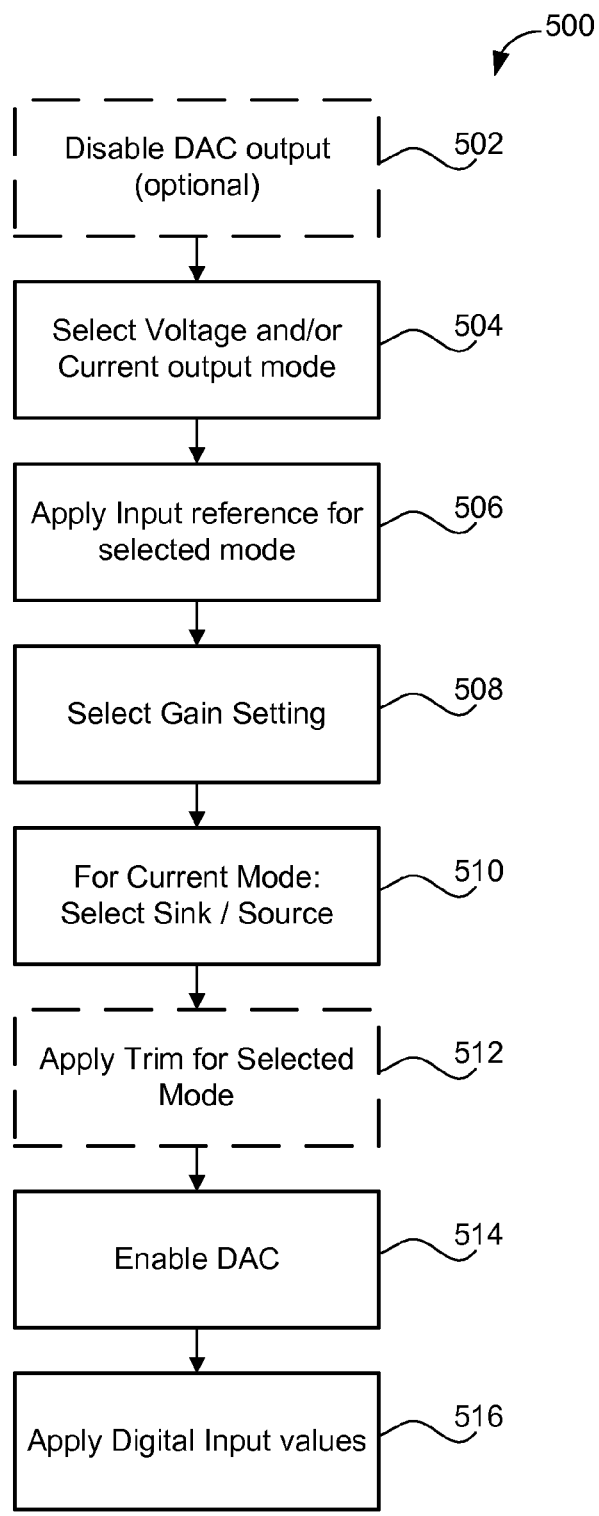
FIG. 5 illustrates a flow diagram of one embodiment of a method of operating a multi-mode DAC.

FIG. 5 illustrates a flow diagram of one embodiment of a method of operating a multi-mode DAC. The method 500 is performed by processing logic that may comprise hardware (circuitry, dedicated logic, etc.), software (such as is run on a general purpose computer system or a dedicated machine), firmware (embedded software), or any combination thereof. In one embodiment, the controller 210 of FIG. 2 performs the method 500. Alternatively, other processing elements may perform the method 500.

Referring to FIG. 5, processing logic begins with optionally disabling the DAC output of the multi-mode DAC (block 502) (e.g., analog current output 207 and/or analog voltage output 205 of multi-mode DAC 300). Next, processing logic selects the desired mode of the multi-mode DAC 300 (block 504), such as the voltage mode, the current mode, or the voltage-current mode, for example. The processing logic applies an input reference for the selected mode (block 506), selects the gain setting for the selected mode (block 508), and selects a current source or a current sink when a current mode is selected (block 510). The processing logic optionally applies a trim for the selected mode (block 512). Next, the processing logic enables the DAC output (block 514) (e.g., analog current output 207 and/or analog voltage output 205 of multi-mode DAC 300), and applies digital input values (e.g., digital code input 201) to the multi-mode DAC input (block 516).

In another embodiment, the method receives a digital code input at the multi-mode DAC and provides a current output, corresponding to the digital code input, on a first terminal of the multi-mode DAC when in a current mode, and provides a voltage output, corresponding to the digital code input, on a second output terminal when in a voltage mode. In one embodiment, when the voltage-current mode is selected at block 504, the method provides the current output and the voltage output concurrently. In the depicted embodiment, when the current mode is selected at block 504, the method selects one of a current sink mode and a current source mode at block 510, and provides a current sink or a current source for the current output based on the selection at block 510. In another embodiment, there may be two separate current modes that can be selected at block 504—a current sink mode and a current source mode.

In another embodiment, when the method receives the current range input at block 508 (referred to as the gain setting), the method scales the current output based on the current range input. In another embodiment, when the method receives the voltage range input at block 508 (referred to as the gain setting). the method scales the voltage output based on the voltage range input. In another embodiment, when the method receives the trimming input at block 512, the method adjusts the current output when the current mode is selected at block 504, and adjusts the voltage output when the voltage mode is elected at block 504. In another embodiment, the method adjusts both the current output and the voltage output when the voltage-current mode is selected at block 504.

Embodiments of the present invention, described herein, include various operations. These operations may be performed by hardware components, software, firmware, or a combination thereof. As used herein, the term "coupled to" may mean coupled directly or indirectly through one or more intervening components. Any of the signals provided over various buses described herein may be time multiplexed with other signals and provided over one or more common buses. Additionally, the interconnection between circuit components or blocks may be shown as buses or as single signal lines. Each of the buses may alternatively be one or more single signal lines and each of the single signal lines may alternatively be buses.

Certain portions of the embodiments may be implemented as a computer program product that may include instructions stored on a computer-readable medium. These instructions may be used to program a general-purpose or special-purpose processor to perform the described operations. A computer-readable medium includes any mechanism for storing or transmitting information in a form (e.g., software, processing application) readable by a machine (e.g., a computer). The computer-readable storage medium may include, but is not limited to, magnetic storage medium (e.g., floppy diskette); optical storage medium (e.g., CD-ROM); magneto-optical storage medium; read-only memory (ROM); random-access memory (RAM); erasable programmable memory (e.g., EPROM and EEPROM); flash memory, or another type of medium suitable for storing electronic instructions. The computer-readable transmission medium includes, but is not limited to, electrical, optical, acoustical, or other form of propagated signal (e.g., carrier waves, infrared signals, digital signals, or the like), or another type of medium suitable for transmitting electronic instructions.

Additionally, some embodiments may be practiced in distributed computing environments where the computer-readable medium is stored on and/or executed by more than one computer system. In addition, the information transferred between computer systems may either be pulled or pushed across the transmission medium connecting the computer systems.

Although the operations of the method(s) herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

In the foregoing specification, the invention has been described with reference to specific exemplary embodiments thereof. It will be evident, however, that various modifications and changes may be made thereto without departing from the broader spirit and scope of the invention as set forth in the appended claims. The specification and drawings are, accordingly, to be regarded in an illustrative sense rather than a restrictive sense.

What is claimed is:

1. A circuit, comprising
a digital-to-analog converter (DAC) configured to receive a digital code input, wherein the DAC comprises:
a first output terminal configured to provide a current output based on the digital code input;
a second output terminal configured to provide a voltage output based on the digital code input; and
a first selection circuit coupled to receive an input voltage reference and an input current reference, the first selection circuit configured to utilize the input voltage reference to provide either or both the current output or the voltage output when the input voltage reference is selected and to utilize the input current reference to provide either or both the current output or the voltage output when the input current reference is selected.

2. The circuit of claim 1, wherein the DAC further comprises a mode-select terminal configured to select one of a plurality of modes for the DAC, and wherein the DAC is configured to provide the current output when a current mode is selected and the voltage output when a voltage mode is selected.

3. The circuit of claim 2, wherein at least one of the plurality of modes comprises a voltage-current mode, and wherein the DAC is configured to provide the current output and the voltage output concurrently when the voltage-current mode is selected.

4. The circuit of claim 2, wherein the plurality of modes comprise a current source mode and a current sink mode, and wherein the DAC is configured to provide a current source for the current output when the current source mode is selected and provide a current sink for the current output when the current source mode is selected.

5. The circuit of claim 2, wherein the DAC further comprises:
a DAC array configured to receive the digital code input and provide an analog current output;
a current output circuit coupled to the DAC array, wherein the current output circuit is configured to receive the analog current output from the DAC array and a current range input, and to provide the current output on the first output terminal according to the analog current output and the current range input; and
a voltage output circuit coupled to the DAC array, wherein the voltage output circuit is configured to receive the analog current output from the DAC array and a voltage range input, and to provide the voltage output on the second output terminal according to the analog current output and the voltage range input.

6. The circuit of claim 5, wherein the current output circuit comprises:
a decoder configured to receive a selection input configured to select whether the current output circuit provides a current source or a current sink for the current output on the first output terminal, and to receive the current range input configured to scale the current output on the first output terminal, wherein the decoder is configured to provide a plurality of switch controls; and
a plurality of current minors configured to provide the current output on the first output terminal based on the plurality of switch controls.

7. The circuit of claim 6, wherein the plurality of current mirrors comprises:

a first N-type current minor configured to receive the analog current output from the DAC array, and provide a first output reference;
a plurality of N-type scaling current minors coupled to the first N-type current mirror, wherein the plurality of N-type scaling current mirrors are each configured to receive the first output reference and produce a scaled current output according to a corresponding scaling value of the respective N-type scaling current mirror, wherein the plurality of N-type scaling current mirrors provide the current sink for the current output on the first output terminal;
a first P-type current minor coupled to the first N-type current mirror, wherein the first P-type current minor is configured to provide a second output reference;
a plurality of P-type scaling current minors coupled to the first P-type current mirror, wherein the plurality of P-type scaling current mirrors are each configured to receive the second output reference and produce a scaled current output according to a corresponding scaling value of the respective P-type scaling current mirror, wherein the plurality of P-type scaling current mirrors provide the current source for the current output on the first output terminal; and
a plurality of switches, each of which is coupled to outputs of the plurality of N-type scaling current mirrors and the plurality of P-type scaling current minors, and wherein each of the plurality of switches is configured to be controlled by one of the plurality of switch controls provided by the decoder.

8. The circuit of claim 5, wherein the voltage output circuit is configured to convert the analog current output from the DAC array into the voltage output, and wherein the voltage output circuit comprises a selectable resistance to scale the voltage output according to the voltage range input.

9. The circuit of claim 5, wherein the DAC further comprises a trimming circuit configured to receive a trimming input for each of the plurality of modes, and wherein the trimming circuit is configured to adjust a gain of the DAC array to adjust the analog current output of the DAC array.

10. The circuit of claim 5, wherein the first selection circuit comprises a first switch and a second switch, wherein the first switch is configured to receive the input current reference and is configured to provide the input current reference to the DAC array as an analog current input when the input current reference is selected, and wherein the second switch is configured to receive a second current reference and is configured to provide the second current reference to the DAC array as the analog current input when the input voltage reference is selected, wherein the second current reference is representative of the input voltage reference.

11. The circuit of claim 10, further comprising a voltage-to-current converter configured to convert the input voltage reference to the second current reference.

12. A circuit, comprising
a multi-mode digital-to-analog converter (DAC) to operate in a plurality of modes including at least a current mode and a voltage mode, wherein the multi-mode DAC is configured to receive a digital code input, to provide an analog current output, corresponding to the digital code input, when in the current mode, to provide a voltage output, corresponding to the digital code input, when in the voltage mode, wherein the multi-mode DAC is configured to receive an input voltage reference and an input current reference, and wherein the multi-mode DAC is configured to utilize the input voltage reference to provide either or both the current output or the voltage output when the input voltage reference is selected and to utilize the input current reference to provide either or both the current output or the voltage output when the input current reference is selected.

13. The circuit of claim 12, wherein the multi-mode DAC comprises a programmable output range for each of the plurality of modes, including a multi-range current output when the multi-mode DAC is in the current mode and a multi-range voltage output when the multi-mode DAC is in the voltage mode.

14. The circuit of claim 12, wherein the multi-mode DAC comprises a programmable trimming circuit configured to individually adjust the analog current output and the voltage output for each of the plurality of modes.

15. The circuit of claim 12, wherein the multi-mode DAC comprises a programmable current output circuit to select a current sink for the analog current output or a current source for the analog current output.

16. The circuit of claim 12, further comprising a DAC, wherein an output of the DAC is combined with at least one of the analog current output and the voltage output of the multi-mode DAC.

17. A method, comprising:
receiving a digital code input at a multi-mode digital-to-analog converter (DAC), the multi-mode DAC to operate in a plurality of modes including at least a current mode and a voltage mode;
providing a current output, corresponding to the digital code input, when in the current mode;
providing a voltage output, corresponding to the digital code input, when in the voltage mode; and
receiving at the multi-mode DAC an input voltage reference and an input current reference;
selecting between the input voltage reference and the input current reference for either or both said providing the current output and said providing the voltage output.

18. The method of claim 17, further comprising providing the current output and the voltage output concurrently when one of the plurality of modes is selected.

19. The method of claim 17, wherein providing the current output comprises selecting one of a current sink mode and a current source mode of the plurality of modes, and wherein said providing the current output comprises:
providing the current output as a current sink when the current sink mode is selected; and
providing the current output as a current source when the current source mode is selected.

20. The method of claim 17, further comprising:
receiving a current range input at the multi-mode DAC while the multi-mode DAC operates in the current mode;
scaling the current output based on the current range input;
receiving a voltage range input at the multi-mode DAC while the multi-mode DAC operates in the voltage mode; and
scaling the voltage output based on the voltage range input.

21. The method of claim 17, further comprising:
receiving a trimming input at the multi-mode DAC;
adjusting the current output according to the trimming input when the multi-mode DAC operates in the current mode; and
adjusting the voltage output according to the trimming input when the multi-mode DAC operates in the voltage mode.

22. The method of claim 17, further comprising combining an output of a DAC with at least one of the current output and the voltage output of the multi-mode DAC.

* * * * *